Jan. 14, 1969 I. F. ORRELL, JR 3,422,282

LEVEL CONVERSION CIRCUIT FOR INTERFACING LOGIC SYSTEMS

Filed Aug. 24, 1965

Irving F. Orrell, Jr.,
INVENTOR.

BY Harry M. Saragovitz
Edward J. Kelly
Herbert Berl
Robert C. Sims

United States Patent Office 3,422,282

Patented Jan. 14, 1969

3,422,282

LEVEL CONVERSION CIRCUIT FOR INTERFACING LOGIC SYSTEMS

Irving F. Orrell, Jr., Whitinsville, Mass., assignor, by mesne assignments, to the United States of America as represented by the Secretary of the Army Filed Aug. 24, 1965, Ser. No. 482,309

U.S. Cl. 307—203 6 Claims

Int. Cl. H03k 19/12; 19/8

ABSTRACT OF THE DISCLOSURE

A voltage level conversion circuit for interfacing logic systems which maintains the logic levels on both sides of the interface. A driving logic source controls the signal applied to a logic load, wherein the interfacing voltages are greater in magnitude on the driving side of the interface. Three diodes are used in conjunction with a transistor to maintain the voltage separation between the logic source and the logic load. Activation of the transistor by the logic source changes the biasing of two diodes which in turn changes the bias of the third diode to activate the load. De-activating the transistor returns the circuit to its previous state.

This invention relates generally to an electrical interface conversion circuit and more particularly this invention relates to a level conversion circuit for interfacing logic systems where the driving logic levels are identical in polarity and of greater magnitude than the driven logic types.

When interfacing logic systems of different voltage levels of operation, there is a need for a circuit which will allow for the preservation of logic levels on both sides of the interface without overloading the driving logic circuit. There is further a need for an interfacing circuit which will give a good degree of noise protection between the two systems.

In view of these facts, an object of this invention is to provide a logic interface level conversion circuit which preserves logic levels on both sides of the interface.

Another object of this invention is to provide an interfacing circuit which does not overload the driving logic source.

Further, an object of this invention is to provide an interfacing circuit which has noise protection from the driving logic circuit to the driven logic circuit.

A still further object of this invention is to provide a less expensive logic interface level conversion circuit.

Various other objects and advantages will appear from the following description of the present invention, and the most novel features will be particularly pointed out hereinafter in connection with the appended claims and the accompanying drawings of the claimed invention in which like reference numerals designate like parts throughout the figures thereof and wherein:

In order to better understand the operation of the system described in the figures, a description of its components is first presented.

Figure 1:
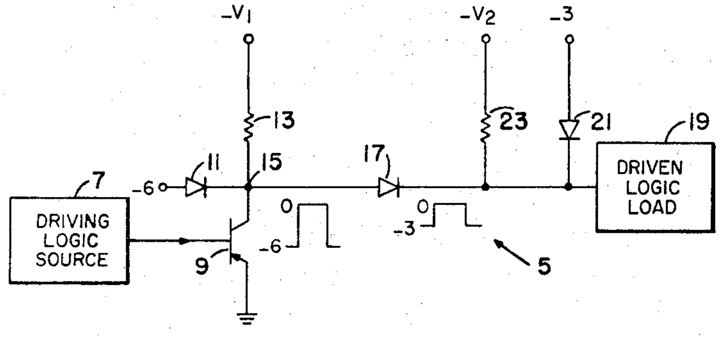
FIGURE 1 is a schematic diagram of a logic interface conversion circuit according to the present invention.

Referring now to FIGURE 1, there is shown an interface level conversion circuit 5 according to the present invention. A driving logic source 7 is connected to the base of transistor 9. The emitter of transistor 9 is connected to ground potential, and the collector is connected to a voltage clamping circuit consisting of diode 11 and resistor 13 at junction 15. For the purpose of illustration only, the driving logic voltage is −6 volts and the driven logic load voltage is −3 volts. A diode 17 is connected between the junction 15 and the driven logic load 19. A second voltage clamping circuit consisting of diode 21 and resistor 23 is connected to the cathode of diode 17.

Figure 2:
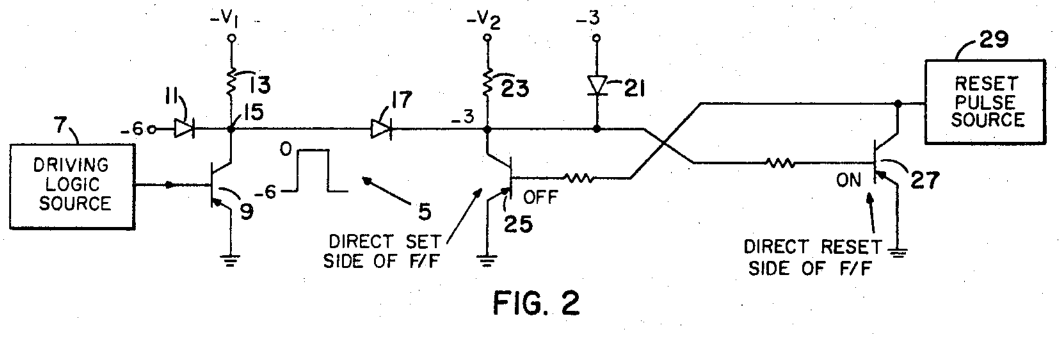
FIGURE 2 is a schematic diagram exemplifying the logic interface conversion circuit in a first logic system.

Referring now to FIGURE 2 there is shown an example employing the interface level conversion circuit where the driving logic source 7 possesses a logic voltage of −6 and 0 volts and is operating a driven flip-flop whose logic voltage is −3 and 0 volts. The flip-flop consists of transistors 25 and 27 connected in a grounded emitter configuration. Here the interface conversion circuit is illustrated as setting the flip-flop and is connected to the base of transistor 27. The collector of transistor 27 is connected to the base of transistor 25 and the collector of transistor 25 is in turn connected to the base of transistor 27. A reset pulse source 29 is provided for the purpose of directly resetting the flip-flop.

In operation the driving condition is a ground going, 6 volt positive pulse or level. Assume that transistor 25 included in the flip-flop is "off." During the portion of time when the driving transistor 9 is "off" (−6 volts), diode 17 is back-biased by a total of 3 volts. During the set time for the flip-flop, transistor 9 is turned "on" and diode 17 becomes conductive when the anode voltage becomes more positive than −3 volts. When the collector of transistor 9 turns "off" again, diode 17 becomes back-biased by a total of 6 volts, −6 volts being applied through diode 11 to the anode and ground potential being applied through transistor 25 to the cathode. After reset of the flip-flop, transistor 25 is no longer conducting and the cathode potential of diode 17 returns to −3 volts. The reset pulse source 29 is an identical technique applied to the reset side of the flip-flop, or an internal resetting by equipment logic.

Figure 3:
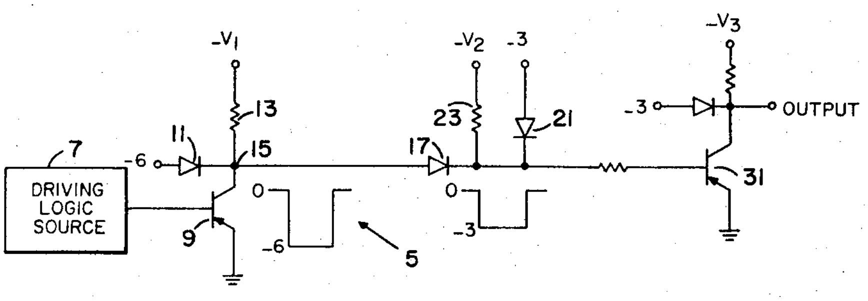
FIGURE 3 is a schematic diagram exemplifying the logic interface conversion circuit in a second logic system.

Referring now to FIGURE 3 there is shown a second example of the use of the interface level conversion circuit whereby an inverter stage is to be driven from the driving logic source. Again −6 volts and 0 volts are assumed to be the driving levels, and −3 volts and 0 volts are the voltage levels of the driven logic circuit. The driven logic circuit consists of a transistor 31 connected in a grounded emitter configuration. The output of the inverter is taken at the collector of transistor 31.

In operation, when transistor 9 is turned "on," diode 17 is conducting and 0 volts appears at the input to the inverter stage, the base of transistor 31. When transistor 9 is turned "off," diode 17 is back-biased and −3 volts appears at the input to the inverter stage via the voltage clamping circuit resistor 23 and diode 21.

It can be seen that the logic levels of both the driving logic and the driven logic are identically preserved. The driving logic is only loaded during that portion of time that the collector of transistor 9 is more positive than −3 volts. Further, a degree of noise protection is afforded as diode 17 is back-biased until the collector of transistor 9 positively approaches −3 volts.

The invention is also applicable to NPN logic by inverting diode 17 and the polarities of voltages applied to the voltage clamping circuits.

While in accordance with the provisions of the statutes, here illustrated and described is the best form of the invention now known to me, it will be apparent to those skilled in the art that changes may be made in the form of the devices disclosed without departing from the spirit of the invention as set forth in the appended claims, and that in some cases certain features of the invention may sometimes be used to advantage without a corresponding use of other features. Accordingly, I desire the scope of my inveniton to be limited only by the appended claims.

What is claimed is:

1. A level conversion circuit for interfacing logic systems comprising: a driven logic system having a first predetermined voltage operating level; a driving logic system having a second predetermined voltage operating level that is greater in magnitude than said first voltage level; and a voltage limiting means connected betwen said driven logic system and said driving logic system so that the logic voltage levels on both sides of said limiting means are preserved.

2. A level conversion circuit for interfacing logic systems as in claim 1 wherein said voltage limiting means is a diode.

3. In a logic system having a driving logic source; a switching means connected to said source; a first voltage supply connected to said switching means through an impedance means providing a first predetermined logic voltage level at the connection to said switching means; a driven logic load; a second voltage supply connected to said driven logic load through an impedance means providing a second predetermined logic voltage level at the connection to said driven logic load; and said second voltage being less in magnitude than said first voltage, the improvement comprising: a voltage converting means connected between said switching means and said driven logic load whereby the driving logic source is able to drive said driven logic load.

4. In a logic system as in claim 3 where said converting means is a diode which is held back-biased until the magnitude of said first logic voltage level is decreased to the value of said second logic voltage level thus allowing a logic bit to be applied to said driven logic load at the lower logic voltage.

5. A level conversion circuit for interfacing logic systems comprising: a transistor having a base, emitter and collector; said emitter of said transistor being connected to ground potential; a driving logic source connected to said base of said transistor; a first voltage supply connected to said collector of said transistor through a first resistor; a second voltage supply connected to said collector through a first diode; a driven logic load connected to said collector through a second diode; a third voltage supply connected to said second diode through a second resistor on the driven logic load side; and a fourth voltage supply connected to said second diode through a third diode on the driven logic load side.

6. A level conversion circuit for interfacing logic systems as in claim 5 wherein said first and second voltage supply is greater in magnitude than said third and fourth voltage supply.

References Cited

UNITED STATES PATENTS

| | | | |
|---|---|---|---|
| 2,999,173 | 9/1961 | Ruck | 307—235 |
| 3,114,052 | 12/1963 | Rowe | 307—215 |
| 3,171,984 | 3/1965 | Eshelman | 307—215 |
| 3,218,483 | 11/1965 | Clapper | 307—203 X |

OTHER REFERENCES

Pressman, Design of Transistorized Circuits for Digital Computers, 1959, (pp. 135, 145, 146).

ARTHUR GAUSS, *Primary Examiner.*

DONALD D. FORRER, *Assistant Examiner.*

U.S. Cl. X.R.

307—214, 247, 237, 292